(12) United States Patent
Shinohara

(10) Patent No.: US 11,553,149 B2
(45) Date of Patent: Jan. 10, 2023

(54) SOLID-STATE IMAGING DEVICE, IMAGING SYSTEM AND MOVABLE OBJECT

(71) Applicant: CANON KABUSHIKI KAISHA, Tokyo (JP)

(72) Inventor: Mahito Shinohara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 183 days.

(21) Appl. No.: 16/986,117

(22) Filed: Aug. 5, 2020

(65) Prior Publication Data

US 2020/0366858 A1 Nov. 19, 2020

Related U.S. Application Data

(63) Continuation of application No. 15/837,414, filed on Dec. 11, 2017, now Pat. No. 10,771,720.

(30) Foreign Application Priority Data

Dec. 28, 2016 (JP) .............................. JP2016-255913

(51) Int. Cl.
*H04N 5/369* (2011.01)
*H01L 27/146* (2006.01)

(52) U.S. Cl.
CPC ......... *H04N 5/369* (2013.01); *H01L 27/1461* (2013.01); *H01L 27/14601* (2013.01);
(Continued)

(58) Field of Classification Search
CPC ........ H04N 5/369; H04N 5/341; H04N 5/378; H01L 27/14679; H01L 27/14601;
(Continued)

(56) References Cited

U.S. PATENT DOCUMENTS 9,755,094 B2  9/2017 Sakai
10,057,519 B2  8/2018 Kobayashi
(Continued)

FOREIGN PATENT DOCUMENTS

CN  102709304    6/2013
CN  104917980 A  9/2015
(Continued)

OTHER PUBLICATIONS

European Search Report dated May 16, 2018 in European Application No. 17208348.7. (Previously cited during prosecution of parent U.S. Appl. No. 15/837,414.).
(Continued)

*Primary Examiner* — Lin Ye
*Assistant Examiner* — Chan T Nguyen
(74) *Attorney, Agent, or Firm* — Venable LLP

(57) ABSTRACT

A solid-state imaging device includes a plurality of pixels, each of the plurality of pixels including a photoelectric converter. The photoelectric converter includes a first semiconductor region of a first conductivity type, a second semiconductor region of a second conductivity type provided under the first semiconductor region, and a third semiconductor region of the first conductivity type provided under the second semiconductor region. The second semiconductor region has a first end portion and a second end portion opposing to the first end portion. The third semiconductor region has a first region and a second region overlapping with the second semiconductor region in a plan view, and the first region and the second region are spaced apart from each other from a part of the first end portion to a part of the second end portion.

16 Claims, 13 Drawing Sheets

(52) U.S. Cl.
CPC .. *H01L 27/14607* (2013.01); *H01L 27/14612* (2013.01); *H01L 27/14679* (2013.01); *H01L 27/1463* (2013.01); *H01L 27/14643* (2013.01)

(58) Field of Classification Search
CPC ........... H01L 27/1463; H01L 27/14643; H01L 27/14607; H01L 27/1461; H01L 27/14612; H01L 27/14605
USPC ......... 348/294; 358/482, 513, 514; 257/222, 257/223, 225–234, 257, 258, 291, 292, 257/294, 431–448
See application file for complete search history.

(56) References Cited

U.S. PATENT DOCUMENTS

| | | | |
|---|---|---|---|
| 2010/0066882 | A1 | 3/2010 | Nagai |
| 2014/0246748 | A1* | 9/2014 | Hynecek ........... H01L 27/14689 257/443 |
| 2015/0054972 | A1* | 2/2015 | Hashimoto ........ H04N 5/23229 348/216.1 |
| 2015/0060951 | A1 | 3/2015 | Hynecek |
| 2016/0163897 | A1 | 6/2016 | Sakai |

FOREIGN PATENT DOCUMENTS

| | | |
|---|---|---|
| JP | 2008-78302 | 4/2008 |
| JP | 2014-45217 A | 3/2014 |
| JP | 2014-165286 | 9/2014 |
| JP | 2015-226255 | 12/2015 |
| JP | 2016-111082 | 6/2016 |

OTHER PUBLICATIONS

Japanese Office Action dated Oct. 23, 2018 during prosecution of related Japanese application No. 2016-255913. (English-language machine translation included.)(Previously cited during prosecution of parent U.S. Appl. No. 15/837,414.).

Chinese Office Action issued in corresponding Chinese Application No. 201711414300.4 dated Sep. 14, 2022 (whole English translation included).

\* cited by examiner

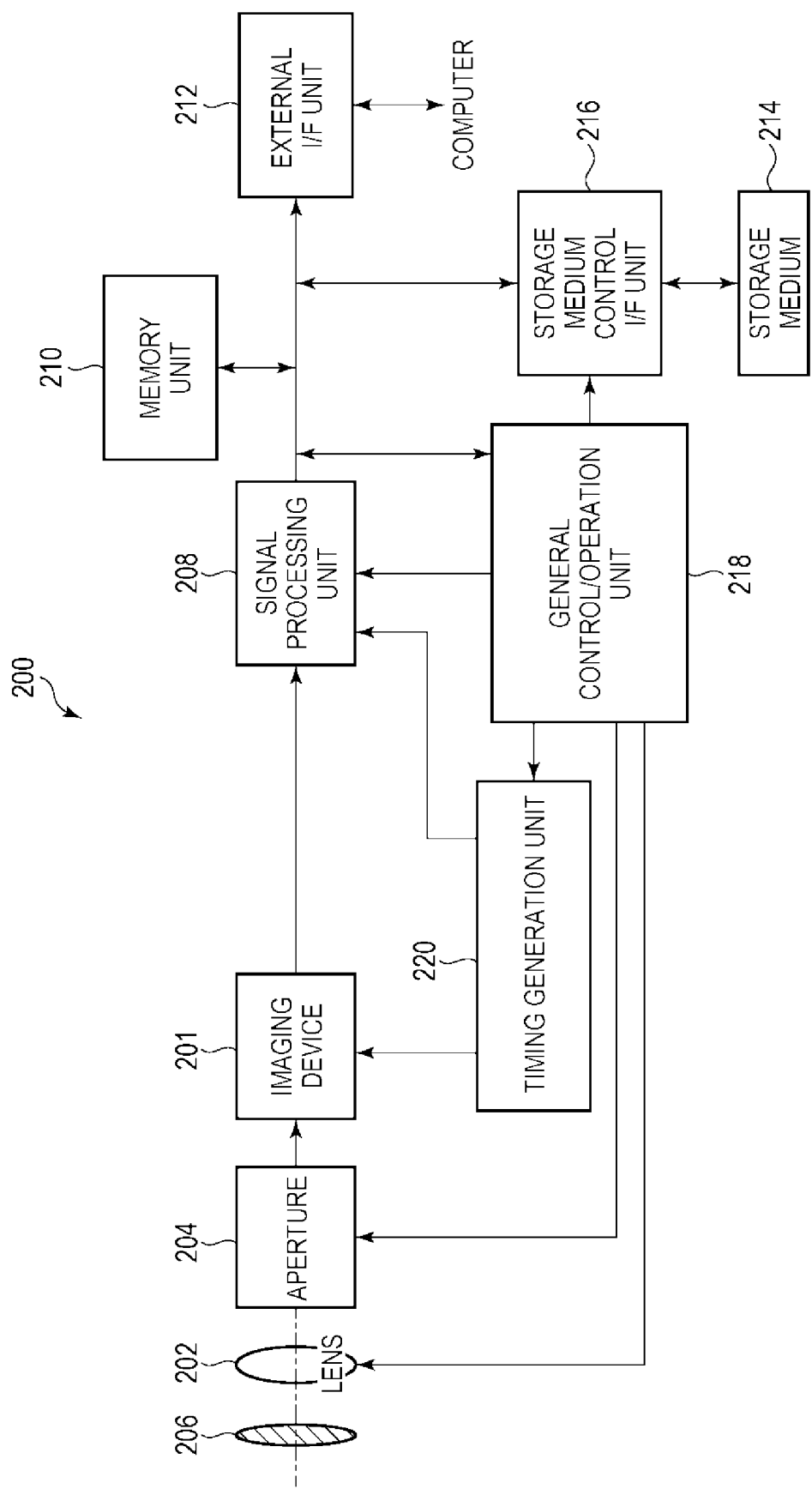

SOLID-STATE IMAGING DEVICE, IMAGING SYSTEM AND MOVABLE OBJECT

This application is a continuation of U.S. application Ser. No. 15/837,414, filed on Dec. 11, 2017.

BACKGROUND OF THE INVENTION

Field of the Invention

The present invention relates to a solid-state imaging device and an imaging system.

Description of the Related Art

In a solid-state imaging device represented by a CCD image sensor or a CMOS image sensor, the sensitivity and the saturation charge amount of the photoelectric converter are important characteristics that determine the performance of the solid-state imaging device. Photoelectric converters using an embedded photodiode that includes p-n junction with a p-type semiconductor region provided in a surface portion of a semiconductor substrate and an n-type semiconductor region forming a charge accumulation region become the main stream as a photoelectric converter of a CCD image sensor or a CMOS image sensor. In this case, signal carriers generated in the photoelectric converter are electrons.

The structure of a substrate in which a photoelectric converter is arranged may be an n-type substrate structure and a p-well structure. The n-type substrate structure is a structure in which a p-type semiconductor region is provided in a deep portion of an n-type semiconductor substrate having a low impurity concentration and a photoelectric converter is arranged inside the n-type semiconductor region of the substrate surface portion electrically isolated from a semiconductor substrate located in a deeper portion. The p-well structure is a structure in which a photoelectric converter is arranged inside a p-well provided in the surface portion of a semiconductor substrate.

The low-concentration n-type substrate structure is characterized by its high sensitivity because signal charges generated within the n-type semiconductor region are collected by the drift force. A solid-state imaging device having a photoelectric converter of the n-type substrate structure is disclosed in Japanese Patent Application Laid-Open No. 2008-078302, for example. On the other hand, the p-well structure is featured in that the saturation charge amount is large because a p-n junction capacitor is formed between an n-type semiconductor region forming a charge accumulation region and a p-well. A solid-state imaging device having a photoelectric converter of the p-well structure is disclosed in Japanese Patent Application Laid-Open No. 2014-165286, for example. In the solid-state imaging devices disclosed in Japanese Patent Application Laid-Open No. 2008-078302 and Japanese Patent Application Laid-Open No. 2014-165286, the saturation charge amount of a photoelectric converter is increased by arranging higher concentration p-type semiconductor region under an n-type semiconductor region forming a charge accumulation region.

However, the configuration of the solid-state imaging devices disclosed in Japanese Patent Application Laid-Open No. 2008-078302 and Japanese Patent Application Laid-Open No. 2014-165286 is not necessarily appropriate in achieving both a high sensitivity and a large saturation charge amount.

SUMMARY OF THE INVENTION

An object of the present invention is to provide a solid-state imaging device that can realize a high sensitivity and a large saturation charge amount of a photoelectric converter in a stable manner.

According to one aspect of the present invention, there is provided a solid-state imaging device including a plurality of pixels, each of the plurality of pixels including a photoelectric converter, wherein the photoelectric converter includes a first semiconductor region of a first conductivity type, a second semiconductor region of a second conductivity type provided under the first semiconductor region, and a third semiconductor region of the first conductivity type provided under the second semiconductor region, wherein the second semiconductor region has a first end portion and a second end portion opposing to the first end portion, and wherein the third semiconductor region has a first region and a second region, each of the first region and the second region overlaps with the second semiconductor region in a plan view, and the first region and the second region are spaced apart from each other from a part of the first end portion to a part of the second end portion.

Further, according to another aspect of the present invention, there is provided a solid-state imaging device including a plurality of pixels each of the plurality of pixels including a photoelectric converter, wherein the photoelectric converter includes a first semiconductor region of a first conductivity type, a second semiconductor region of a second conductivity type provided under the first semiconductor region, and a third semiconductor region of the first conductivity type provided under the second semiconductor region, wherein the third semiconductor region has a first region and a second region, each of the first region and the second region overlaps with the second semiconductor region in a plan view, wherein the first region and the second region are isolated from each other by a fourth semiconductor region of the second conductivity type, and wherein the photoelectric converter further includes a fifth semiconductor region of the second conductivity type extending under the fourth semiconductor region, the first region, and the second region.

Further features of the present invention will become apparent from the following description of exemplary embodiments with reference to the attached drawings.

BRIEF DESCRIPTION OF THE DRAWINGS

FIG. 14 is a block diagram illustrating a general configuration of an imaging system according to a sixth embodiment of the present invention.

DESCRIPTION OF THE EMBODIMENTS

Preferred embodiments of the present invention will now be described in detail in accordance with the accompanying drawings.

First Embodiment

A solid-state imaging device according to a first embodiment of the present invention will be described with reference to FIG. 1 to FIG. 5.

Figure 1:
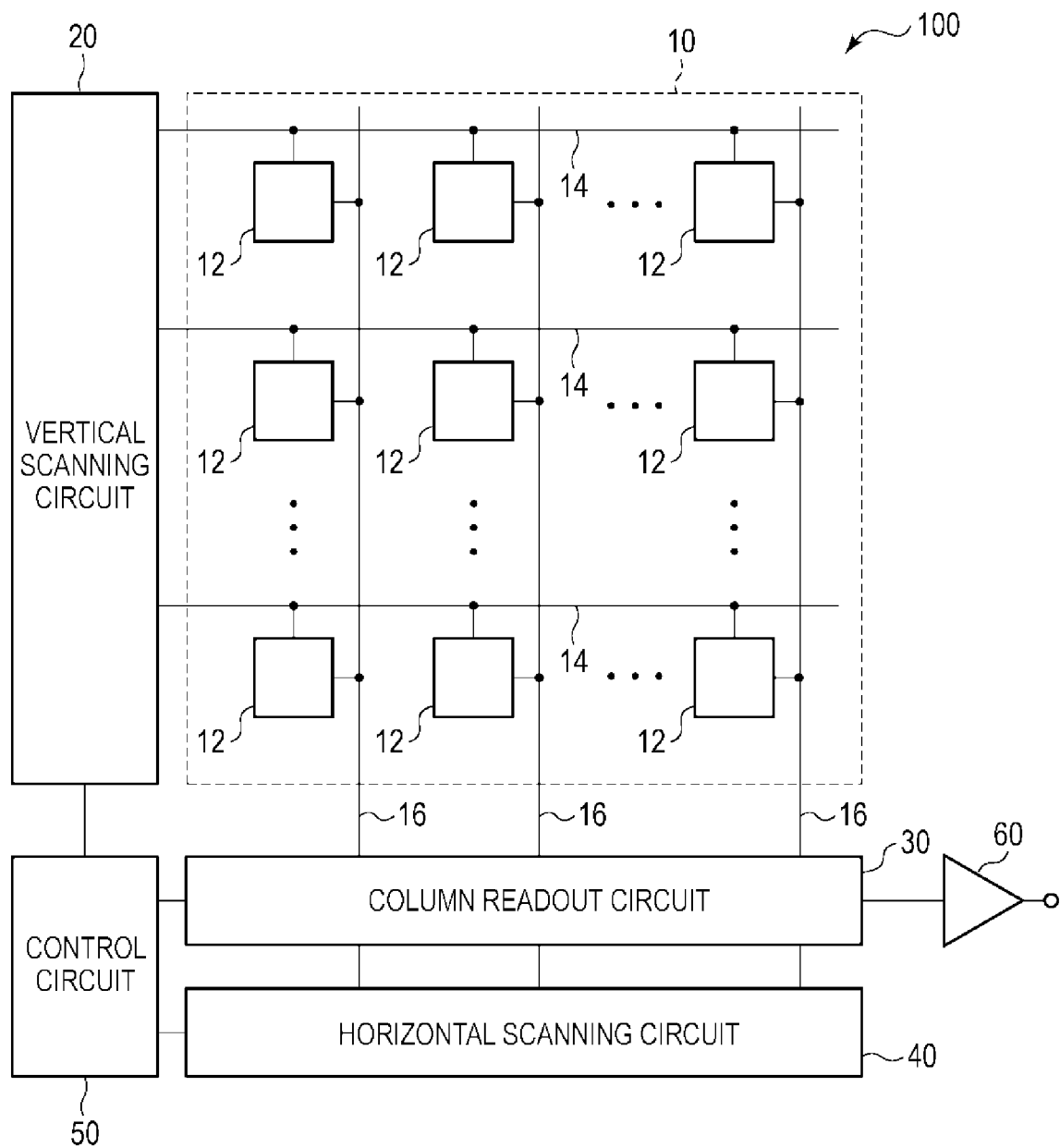
FIG. 1 is a block diagram illustrating the general structure of a solid-state imaging device according to a first embodiment of the present invention.
Figure 2:
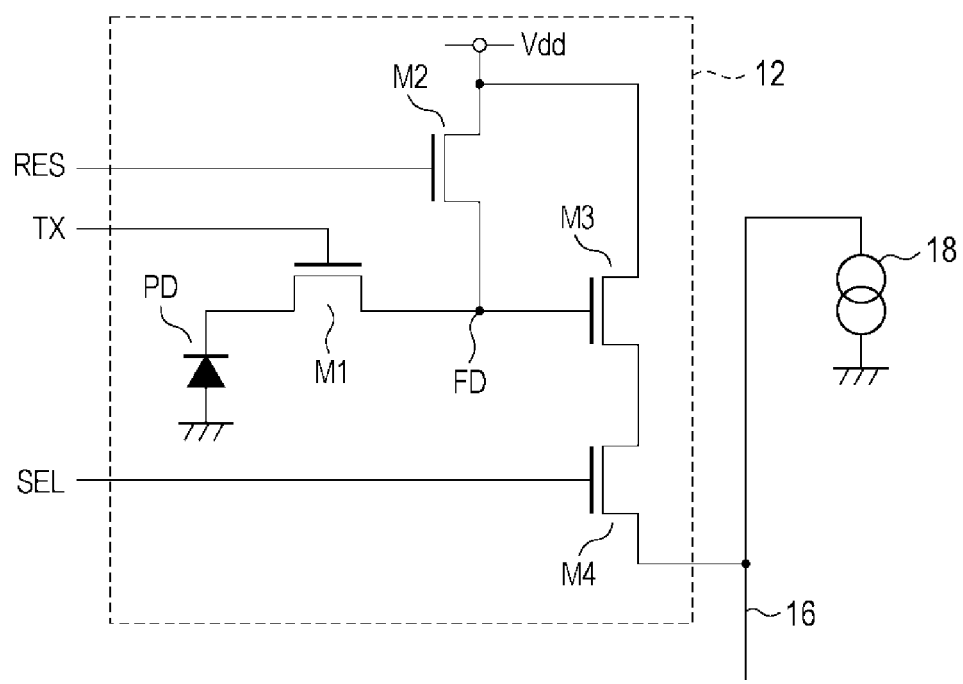
FIG. 2 is an equivalent circuit diagram of a pixel of the solid-state imaging device according to the first embodiment of the present invention.
Figure 3:
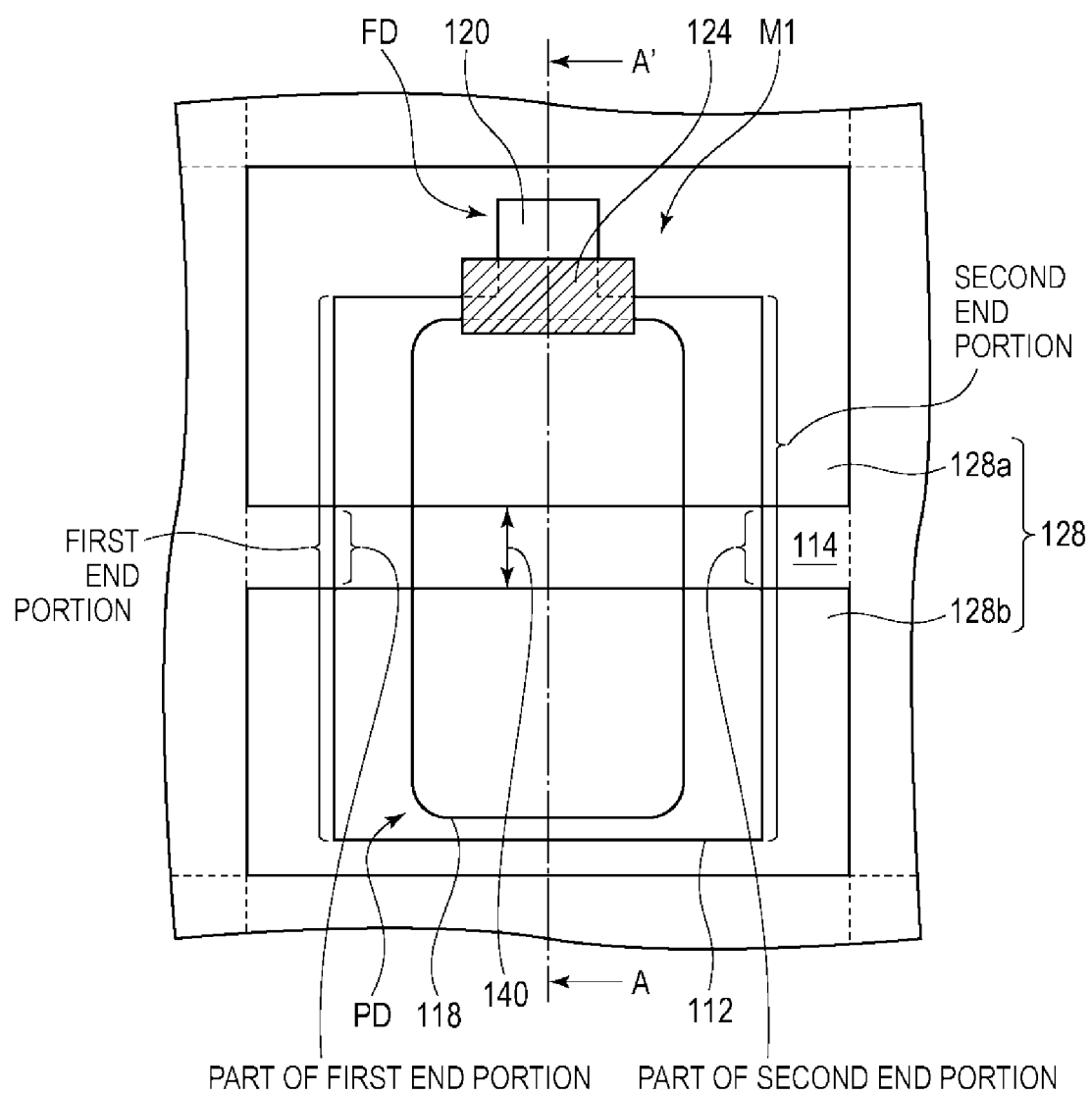
FIG. 3 is a diagram illustrating a planar layout of the pixel of the solid-state imaging device according to the first embodiment of the present invention.
Figure 4:
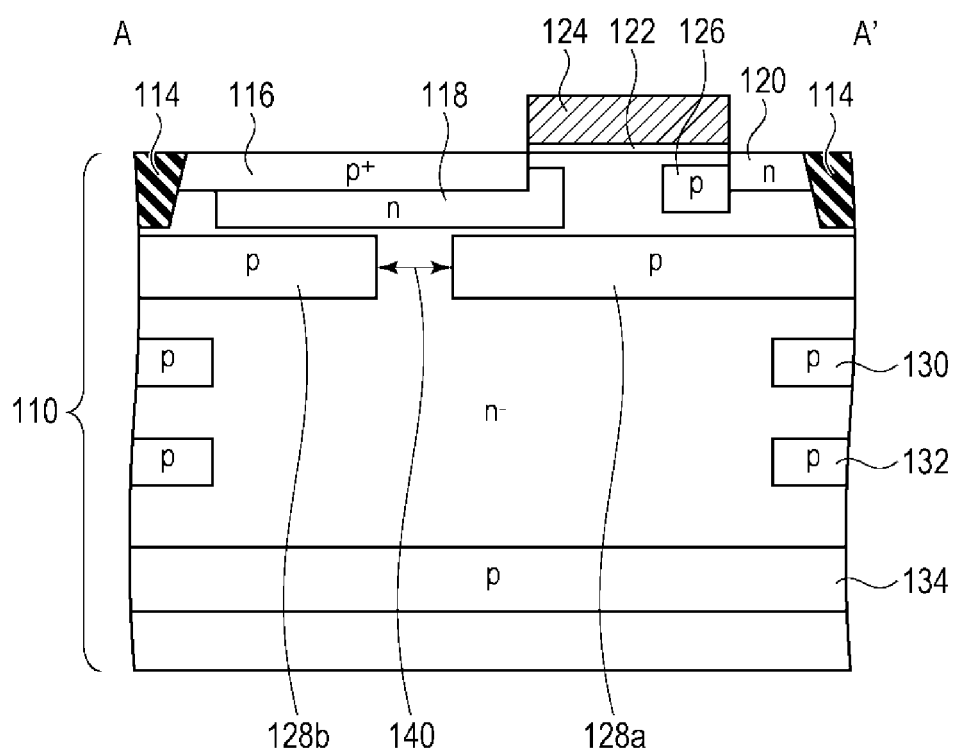
FIG. 4 is a schematic cross-sectional view of the pixel of the solid-state imaging device according to the first embodiment of the present invention.
Figure 5:
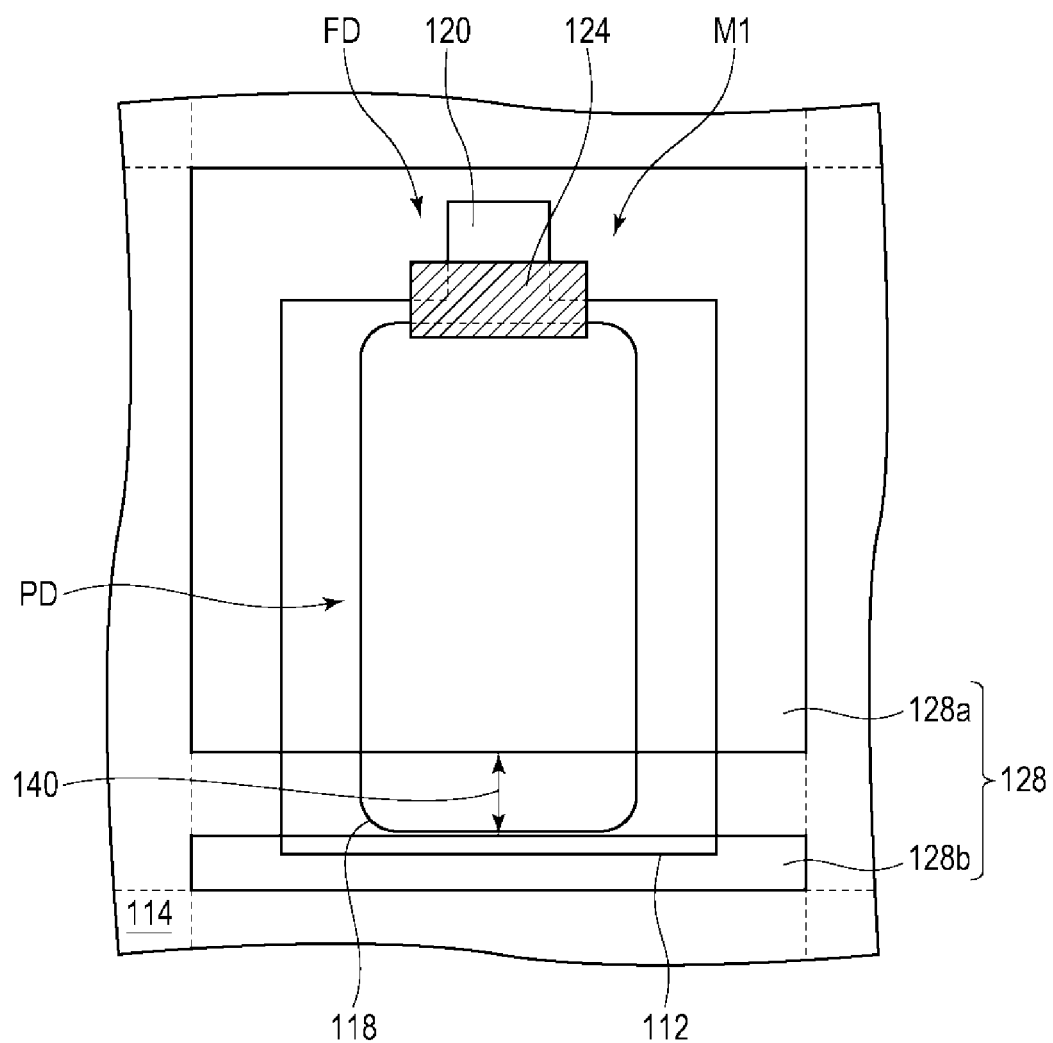
FIG. 5 is a plan view of a pixel of a solid-state imaging device according to a comparative example to the first embodiment.

FIG. 1 is a block diagram illustrating a general configuration of the solid-state imaging device according to the present embodiment. FIG. 2 is an equivalent circuit diagram of a pixel of the solid-state imaging device according to the present embodiment. FIG. 3 is a diagram illustrating a planar layout of the pixel of the solid-state imaging device according to the present embodiment. FIG. 4 is a schematic cross-sectional view of the pixel of the solid-state imaging device according to the present embodiment. FIG. 5 is a plan view of a pixel of a solid-state imaging device according to a comparative example to the present embodiment.

A solid-state imaging device 100 according to the present embodiment includes a pixel region 10, a vertical scanning circuit 20, a column readout circuit 30, a horizontal scanning circuit 40, a control circuit 50, and an output circuit 60, as illustrated in FIG. 1.

A plurality of pixels 12 arranged in a matrix over a plurality of rows and a plurality of columns are provided in the pixel region 10. On each of the rows of a pixel array in the pixel region 10, a control signal line 14 is arranged extending in the row direction (the horizontal direction in FIG. 1). The control signal line 14 is connected to respective pixels 12 aligned in the row direction, which is a signal line common to these pixels 12. Further, on each of the columns of the pixel array in the pixel region 10, a vertical output line 16 is arranged extending in the column direction (the vertical direction in FIG. 1). The vertical output line 16 is connected to respective pixels 12 aligned in the column direction, which is a signal line common to these pixels 12.

The control signal line 14 on each row is connected to the vertical scanning circuit 20. The vertical scanning circuit 20 is a circuit unit that supplies, to the pixels 12 via the control signal lines 14, control signals for driving readout circuits in the pixels 12 when reading out pixel signals from the pixels 12. One end of the vertical output line 16 on each column is connected to the column readout circuit 30. Pixel signals read out from the pixels 12 are input to the column readout circuit 30 via the vertical output lines 16. The column readout circuit 30 is a circuit unit that performs the predetermined pixel signal processing, for example, a signal amplification or an analog-to-digital (AD) conversion. The column readout circuit 30 may include a differential amplifier circuit, a sample-and-hold circuit, an AD conversion circuit, or the like.

The horizontal scanning circuit 40 is a circuit unit that supplies, to the column readout circuit 30, control signals for transferring the pixel signal processed in the column readout circuit 30 to the output circuit 60 sequentially on a column basis. The control circuit 50 is a circuit unit that supplies control signals for controlling operations and the timings of the operations of the vertical scanning circuit 20, the column readout circuit 30, and the horizontal scanning circuit 40. The output circuit 60 is a circuit unit that is formed of a buffer amplifier, a differential amplifier, or the like and outputs the pixel signals read out from the column readout circuit 30 to a signal processing unit outside the solid-state imaging device 100.

As illustrated in FIG. 2, each of the pixels 12 includes a photoelectric converter PD, a transfer transistor M1, a reset transistor M2, an amplifier transistor M3, and a select transistor M4. The photoelectric converter PD is a photodiode, for example, in which the anode thereof is connected to a ground voltage line and the cathode is connected to the source of the transfer transistor M1. The drain of the transfer transistor M1 is connected to the source of the reset transistor M2 and the gate of the amplifier transistor M3. The connection node of the drain of the transfer transistor M1, the source of the reset transistor M2, and the gate of the amplifier transistor M3 forms a so-called floating diffusion (FD) and form a charge-to-voltage converter formed of a capacitor component included in this node. The drain of the reset transistor M2 and the drain of the amplifier transistor M3 are connected to a power source voltage line (Vdd). The source of the amplifier transistor M3 is connected to the drain of the select transistor M4. The source of the select transistor M4 is connected to the vertical output line 16. The other end of the vertical output line 16 is connected to a current source 18.

In a case of the circuit configuration illustrated in FIG. 2, each of the control signal line 14 includes a transfer gate signal line TX, a reset signal line RES, and a select signal line SEL. The transfer gate signal line TX is connected to the gates of the transfer transistors M1. The reset signal line RES is connected to the gates of the reset transistors M2. The select signal line SEL is connected to the gates of the select transistors M4.

The photoelectric converter PD converts (photoelectrically converts) an incident light into signal charges of an amount in accordance with the light amount and accumulates the generated charges. When turned on, the transfer transistor M1 transfers charges of the photoelectric converter PD to the floating diffusion FD. The voltage of the floating diffusion FD becomes a voltage corresponding to the amount of charges transferred from the photoelectric converter PD. The amplifier transistor M3 is configured such that the power source voltage is supplied to the drain and a bias current is supplied to the source from the current source 18 via the select transistor M4 to form an amplifier unit (a source follower circuit) in which the gate is the input node. Thereby, the amplifier transistor M3 outputs a signal based on the voltage of the floating diffusion FD to the vertical output line 16 via the select transistor M4. When turned on, the reset transistor M2 resets the floating diffusion FD to a voltage corresponding to the power source voltage Vdd.

FIG. 3 illustrates a diagram illustrating a planar layout of the pixel 12 of the solid-state imaging device according to the present embodiment. FIG. 4 is a schematic cross-sectional view taken along a line A-A' of FIG. 3. FIG. 3 and FIG. 4 illustrate only the photoelectric converter PD and the transfer transistor M1 out of the components of the pixel 12. Note that, while FIG. 3 illustrates only the planar layout of one pixel 12, the planar layout of FIG. 3 is repeated periodically at a predetermined unit pixel pitch in the horizontal direction and the vertical direction in the actual implementation. The dotted lines illustrated in FIG. 3 are an example of boundary lines between the neighboring pixels 12.

An element isolation insulating region 114 defining an active region 112 is provided in the surface portion of an n-type semiconductor substrate 110 having a low impurity concentration. In the active region 112, arranged are a photodiode forming the photoelectric converter PD, the transfer transistor M1, and the floating diffusion FD as a charge holding portion that holds charges transferred from the photoelectric converter PD.

The photoelectric converter PD is an embedded photodiode that includes a p-type semiconductor region 116 provided in the surface portion of the active region 112 of the semiconductor substrate 110 and an n-type semiconductor region 118 provided adjacent to the lower portion of the p-type semiconductor region 116. The n-type semiconductor region 118 is a charge accumulation layer for accumulating signal charges (electrons) generated by the photoelectric converter PD.

The floating diffusion FD is formed of an n-type semiconductor region 120 provided, spaced apart from the n-type semiconductor region 118, in the surface portion of the active region 112 of the semiconductor substrate 110.

The transfer transistor M1 includes a gate electrode 124 provided over the semiconductor substrate 110 between the n-type semiconductor region 118 and the n-type semiconductor region 120 with a gate insulating film 122 interposed therebetween. A p-type semiconductor region 126 for electrical isolation of the n-type semiconductor region 118 and the n-type semiconductor region 120 is provided inside the semiconductor substrate 110 between the n-type semiconductor region 118 and the n-type semiconductor region 120.

A p-type semiconductor region 128 as a depletion suppression layer for suppressing a depletion layer from expanding downward from the n-type semiconductor region 118 is provided under the n-type semiconductor region 118. The p-type semiconductor region 128 is formed by a stripe pattern extending in the row direction (the horizontal direction in FIG. 3) in a plan view. FIG. 3 illustrates two adjacent stripe-patterned p-type semiconductor regions 128a and 128b and a gap 140 therebetween. The gap 140 between the p-type semiconductor region 128a and the p-type semiconductor region 128b is arranged so as to traverse the n-type semiconductor region 118 in the plan view. Alternatively, when a region where the n-type semiconductor region 118 and the p-type semiconductor region 128a overlap with each other is defined as a first region and a region where the n-type semiconductor region 118 and the p-type semiconductor region 128b overlap with each other is defined as a second region, it can be said that the first region and the second region are spaced apart from each other. The first region and the second region are spaced apart from each other by an n-type semiconductor region (fourth semiconductor region) that is a part of the semiconductor substrate 110. An n-type semiconductor region (fifth semiconductor region) that is another part of the semiconductor substrate 110 extends under the first region, the second region, and the n-type semiconductor region that is a part of the semiconductor substrate 110. Furthermore, the n-type semiconductor region 118, which is the second semiconductor region, has a first end portion and a second end portion opposing to the first end portion in a plan view. It can be said that the first region and the second region are spaced apart from each other over a part of the first end portion and a part of the second end portion. Note that the plan view in the present specification is a two-dimensional planar view obtained by projecting respective components of the solid-state imaging device on a plane parallel to the surface of the semiconductor substrate 110 and, for example, corresponds to a planar layout view of FIG. 3.

In a deep portion of the semiconductor substrate 110, p-type semiconductor regions 130, 132, and 134 are provided. The p-type semiconductor region 130 is responsible for isolation between pixels 12 inside the semiconductor substrate 110. The p-type semiconductor region 132 is responsible for isolation between pixels 12 inside the semiconductor substrate 110 which is deeper than the p-type semiconductor region 130. The p-type semiconductor region 134 is provided for defining a depth at which signal charges generated in the semiconductor substrate 110 are effectively collected. Note that, in the present specification, the surface portion of the semiconductor substrate 110 electrically isolated by the p-type semiconductor region 126 may be called a semiconductor region.

With the p-type semiconductor region 128 being provided under the n-type semiconductor region 118, a p-n junction capacitor is formed between the n-type semiconductor region 118 and the p-type semiconductor region 128. As is apparent from the relational expression represented by $Q=CV$, when a predefined reverse bias voltage V is applied to the p-n junction of the photoelectric converter PD, a larger p-n junction capacitance C results in a larger accumulated charge amount Q. While signal charges accumulated in the n-type semiconductor region 118 are transferred to the signal output unit, after the potential of the n-type semiconductor region 118 reaches a predetermined potential that is defined by the power source voltage or the like, the signal charges of the n-type semiconductor region 118 are no longer transferred. That is, since the variation amount of the voltage V due to the transfer of signal charges is predefined, the saturation charge amount increases proportional to the p-n junction capacitance of the photoelectric converter PD. Therefore, by providing the p-type semiconductor region 128, it is possible to increase the saturation charge amount of the n-type semiconductor region 118 as a charge accumulation layer.

Further, the gap 140 between the p-type semiconductor region 128a and the p-type semiconductor region 128b forms a flowing path of signal charges when signal charges generated inside the semiconductor substrate 110 between the n-type semiconductor region 118 and the p-type semiconductor region 134 are collected into the n-type semiconductor region 118. Therefore, appropriate setting of the size or the shape of the gap 140 or the impurity concentration of the p-type semiconductor region 128 allows signal charges generated inside the semiconductor substrate 110 between the n-type semiconductor region 118 and the p-type semiconductor region 134 to be effectively collected into the n-type semiconductor region 118. That is, the same sensitivity as the sensitivity which would be obtained in the structure without the p-type semiconductor region 128 can be obtained.

Note that it is desirable for the gap 140 to be arranged near the center portion of the n-type semiconductor region 118 in the plan view. The n-type semiconductor region 118 has a potential distribution in which the potential is higher in the center portion and the potential is lower in the end portions. Thus, in effectively collecting signal charges generated in a deeper position than the p-type semiconductor region 128 into the n-type semiconductor region 118 by the drift force, it is effective to provide the gap 140 near the center portion of the n-type semiconductor region 118 having a higher potential. Further, there is an advantage of a shorter flowing path of signal charges in the arrangement of the gap 140 near the center portion of the n-type semiconductor region 118.

Therefore, according to the above-described configuration of the present embodiment, the saturation charge amount of the photoelectric converter PD can be increased without a reduction of the light receiving sensitivity in the photoelectric converter PD.

As described above, in the solid-state imaging device according to the present embodiment, the gap 140 between the p-type semiconductor region 128a and the p-type semiconductor region 128b is arranged so as to traverse the n-type semiconductor region 118 in the plan view. This is intended to suppress characteristics variation due to manufacturing variation.

While the corner portions of the n-type semiconductor region 118 in the plan view are rounded as illustrated in FIG. 3, for example, in the actual formation, the way of the corner portions being rounded is not necessarily constant depending on the condition or the like at the formation. Thus, when the gap 140 is arranged so as to overlap with the end portion of the n-type semiconductor region 118 as illustrated in FIG. 5, for example, the shape of an overlapping portion of the n-type semiconductor region 118 and the gap 140 varies depending on the formation condition or the like of the n-type semiconductor region 118.

If the shape of an overlapping portion of the n-type semiconductor region 118 and the gap 140 varied due to variation at the formation, it would be necessary to set a larger area of the overlapping portion of the n-type semiconductor region 118 and the gap 140 so as to be able to obtain a sufficient sensitivity even with the variation. In this case, however, since the area of overlapping portions of the n-type semiconductor region 118 and the p-type semiconductor regions 128a and 128b decreases, it would be difficult to have a sufficiently large saturation charge amount of the photoelectric converter PD.

In this regard, in the solid-state imaging device according to the present embodiment, the gap 140 between the p-type semiconductor region 128a and the p-type semiconductor region 128b is spaced apart from the corner portions of the n-type semiconductor region 118. Therefore, the shape of the overlapping portion of the n-type semiconductor region 118 and the gap 140 does not change even when the positions among the n-type semiconductor region 118 and the p-type semiconductor regions 128a and 128b are displaced to some extent. That is, in the solid-state imaging device according to the present embodiment, since a constant sensitivity can be obtained regardless of variation at the formation, both of a high sensitivity and a large saturation charge amount can be achieved.

Note that, since variation in the transfer performance of signal charges is likely to occur due to displacement of the mutual positional relationship when the gap 140 overlaps with the gate electrode 124, it is desirable that the gap 140 be arranged so as to traverse the n-type semiconductor region 118 in a direction in which the gate electrode 124 is not located.

As discussed above, according to the present embodiment, it is possible to increase the saturation charge amount while stably maintaining the sensitivity of the photoelectric converter. This can realize a solid-state imaging device having a high sensitivity and a large saturation signal amount in a stable manner.

Second Embodiment

Figure 7:
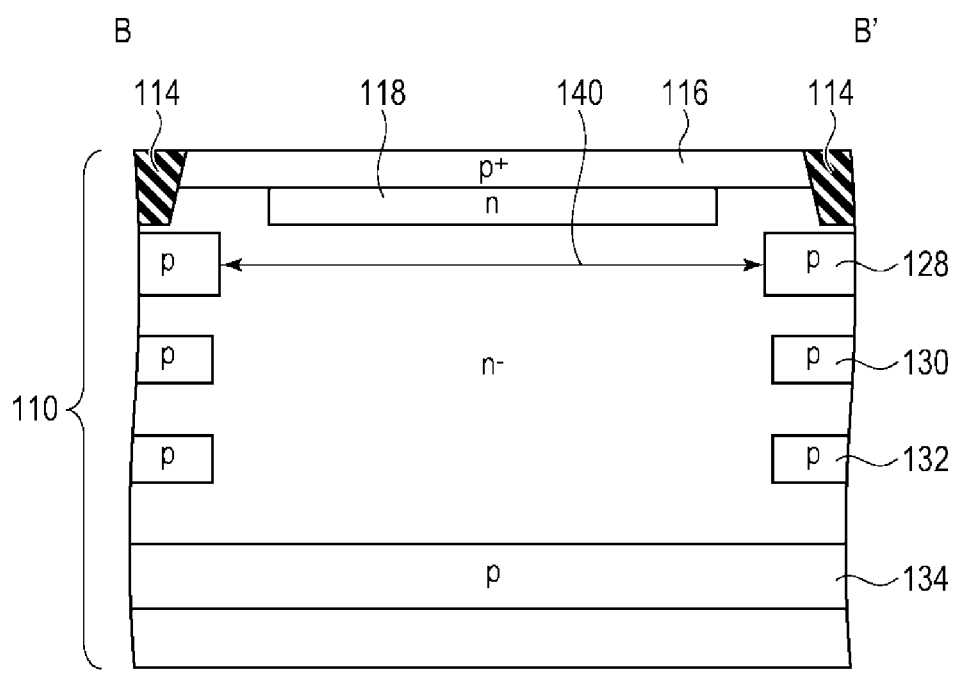
FIG. 7 is a schematic cross-sectional view of the pixel of the solid-state imaging device according to the second embodiment of the present invention.
Figure 8:
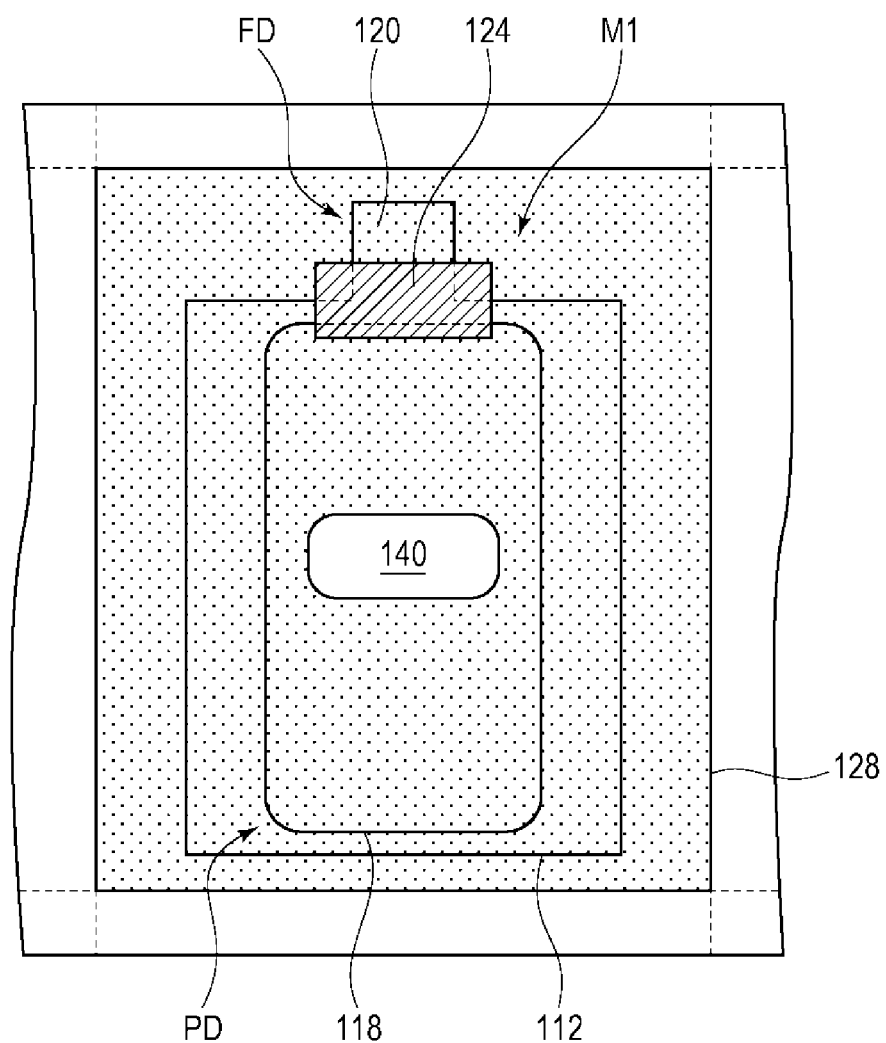
FIG. 8 is a plan view of a pixel of a solid-state imaging device according to a comparative example to the second embodiment.

A solid-state imaging device according to a second embodiment of the present invention will be described with reference to FIG. 6 to FIG. 8. The same components as those in the solid-state imaging device according to the first embodiment are labeled with the same reference numerals, and the description thereof will be omitted or simplified.

Figure 6:
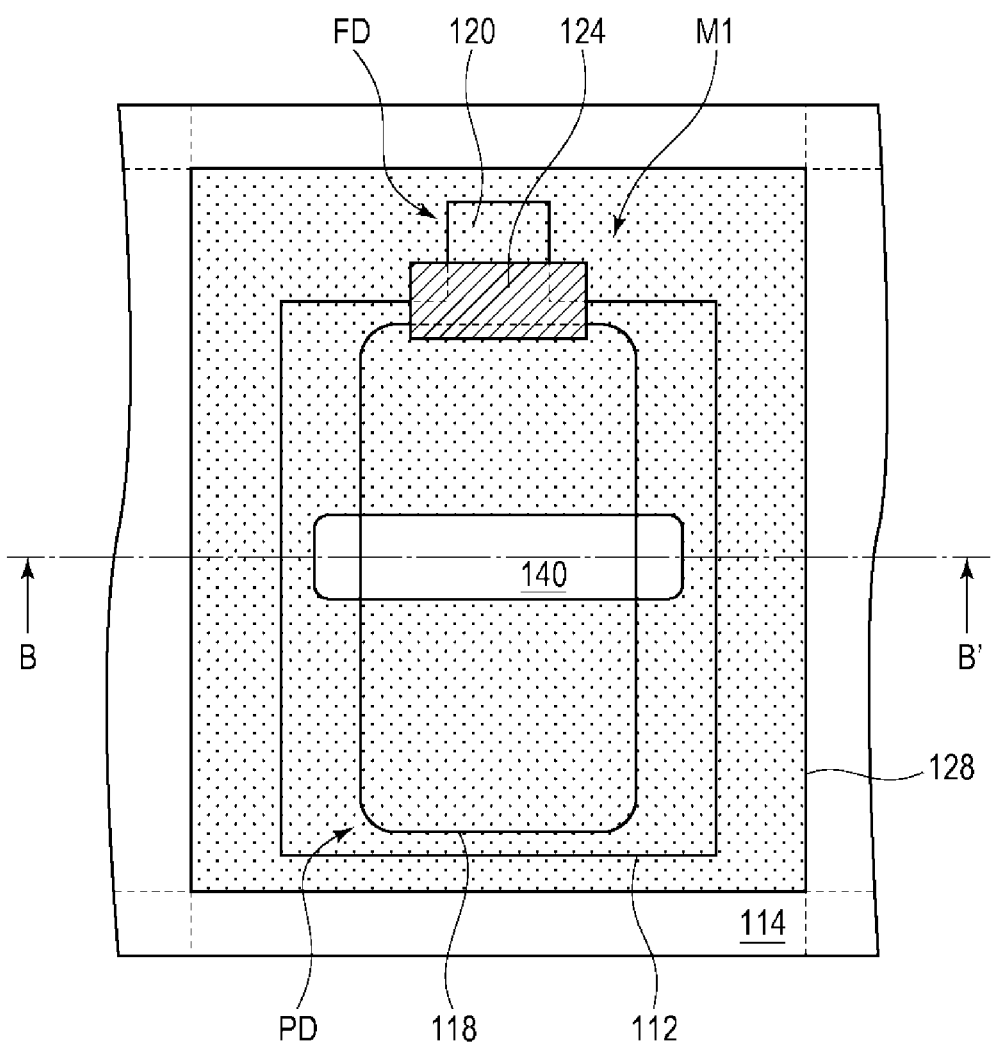
FIG. 6 is a diagram illustrating a planar layout of a pixel of a solid-state imaging device according to a second embodiment of the present invention.

FIG. 6 is a diagram illustrating a planar layout of a pixel of the solid-state imaging device according to the present embodiment. FIG. 7 is a schematic cross-sectional view of the pixel of the solid-state imaging device according to the present embodiment. FIG. 7 is a cross-sectional view taken along a line B-B' of FIG. 6. FIG. 8 is a plan view of a pixel of a solid-state imaging device according to a comparative example to the present embodiment.

The solid-state imaging device according to the present embodiment is different from the solid-state imaging device according to the first embodiment in the arrangement of the gap 140 provided in the p-type semiconductor region 128 for suppressing the depletion layer from expanding downward from the n-type semiconductor region 118.

That is, in the solid-state imaging device according to the present embodiment, as illustrated in FIG. 6, the p-type semiconductor region 128 is laid out such that the gap 140 provided in the p-type semiconductor region 128 is formed as a separate pattern for each pixel 12 and thereby the gaps 140 of the neighboring pixels 12 are not connected to each other. The circumference of the gap 140 is surrounded by the p-type semiconductor region 128 in the plan view. Further, the p-type semiconductor region 128 is laid out such that the corner portions of the gap 140 in the p-type semiconductor region 128 are not located within the n-type semiconductor region 118 in the plan view.

That is, also in the solid-state imaging device according the present embodiment, the gap 140 provided in the p-type semiconductor region 128 is arranged so as to traverse the n-type semiconductor region 118 in the plan view. In other words, an overlapping portion of the n-type semiconductor region 118 and the p-type semiconductor region 128 in the plan view includes the first region and the second region that is spaced apart from the first region by the gap 140.

In the first embodiment, the p-type semiconductor region 128 is arranged such that the p-type semiconductor region 128 (the p-type semiconductor regions 128a and 128b) is formed as a stripe pattern extending in the row direction and the gap between the pattern (the gap 140) traverses the n-type semiconductor region 118. However, when the gaps 140 of the pixels 12 adjacent in the row direction are connected to each other due to the arrangement of the gap 140 in such a way, some layouts of the pixels 12 are likely to cause leakage of signal charges into the neighboring pixel 12 via such the gap 140 resulting in crosstalk between pixels.

However, with the gap 140 being a separate pattern for each of the pixels 12 as seen in the solid-state imaging device according to the present embodiment, the p-type semiconductor region 128 is arranged between the gaps 140 of the neighboring pixels 12, which can reduce crosstalk between pixels.

Further, in a similar manner to the case of the n-type semiconductor region 118 described in the first embodiment, an unpredictable round shape occurs at the formation also in the corner portions of the p-type semiconductor region 128 (the gap 140). Thus, if the gap 140 were arranged inside the n-type semiconductor region 118 as illustrated in FIG. 8, for example, the light receiving sensitivity would vary in accordance with variation of the shape of the gap 140.

However, with the gap 140 being arranged so as to traverse the n-type semiconductor region 118 as seen in the solid-state imaging device of the present embodiment, the shape of the overlapping portion of the n-type semiconductor region 118 and the gap 140 is constant regardless of variation at the formation. Thereby, a constant sensitivity can be obtained regardless of variation at the formation, and both of a high sensitivity and a large saturation charge amount can be achieved.

Therefore, according to the solid-state imaging device of the present embodiment, it is possible to increase the saturation charge amount while stably maintaining the sensitivity of the photoelectric converter and reduce crosstalk between pixels. This can realize a solid-state imaging device having a high sensitivity and a large saturation signal amount in a stable manner.

Third Embodiment

A solid-state imaging device according to a third embodiment of the present invention will be described with reference to FIG. 9. The same components as those in the solid-state imaging devices according to the first and second embodiments are labeled with the same reference numerals, and the description thereof will be omitted or simplified.

Figure 9:
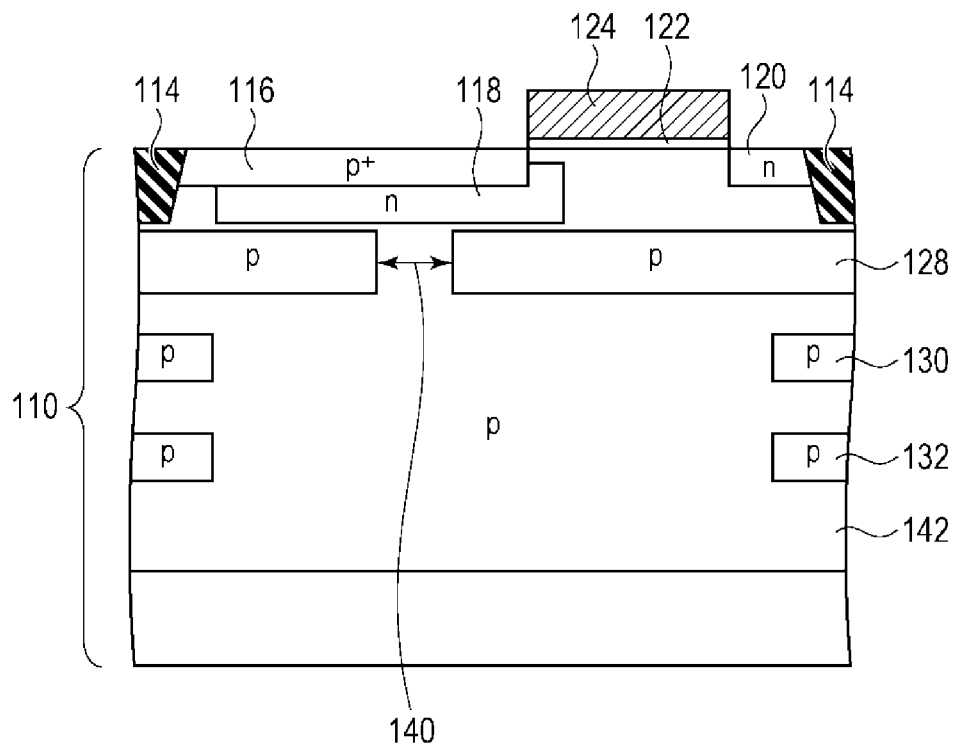
FIG. 9 is a schematic cross-sectional view of a pixel of a solid-state imaging device according to a third embodiment of the present invention.

FIG. 9 is a schematic cross-sectional view of a pixel of the solid-state imaging device according to the present embodiment. In the first and second embodiments, the examples have been illustrated in which the photoelectric converter PD and the transfer transistor M1 are arranged inside the semiconductor substrate 110 of the first conductive type. In the present embodiment, an example will be described in which the photoelectric converter PD and the transfer transistor M1 are arranged inside a well of a conductivity type opposite to that of the semiconductor substrate 110.

The solid-state imaging device according to the present embodiment includes a p-type semiconductor region 142 provided in the n-type semiconductor substrate 110. This p-type semiconductor region 142 forms a p-well. The n-type semiconductor region 118 and the p-type semiconductor regions 116, 128, 130, and 132 are arranged inside the p-type semiconductor region 142. In the present example configuration, since the p-type semiconductor region 142 is formed between the n-type semiconductor region 118 and the n-type semiconductor region 120, the p-type semiconductor region 126 described in the first embodiment is unnecessary. The impurity concentration of the p-type impurity forming the p-type semiconductor regions 128, 130, and 132 is higher than the impurity concentration of the p-type impurity of the p-type semiconductor region 142. Other configurations are the same as those of the solid-state imaging device according to the first or second embodiment.

In the solid-state imaging device of the present embodiment, the gap 140 provided in the p-type semiconductor region 128 is arranged so as to traverse the n-type semiconductor region 118 in the plan view in a similar manner to the case of the first and second embodiments. Therefore, by appropriately setting the size or the shape of the gap 140 or the impurity concentration of the p-type semiconductor region 128, it is possible to obtain higher sensitivity than that obtained by the structure in which the gap 140 is not provided, because the signal charges generating under the p-type semiconductor region 128 is more effectively collected to the n-type semiconductor region 118.

Further, the shape of the overlapping portion of the n-type semiconductor region 118 and the gap 140 can be stably formed regardless of variation at the formation. Therefore, it is not necessary to more expand the gap 140, which can ensure the overlapping area of the n-type semiconductor region 118 and the p-type semiconductor region 128 and allows for a sufficiently large saturation charge amount of the photoelectric converter PD.

The solid-state imaging device of the present embodiment in which the photoelectric converter PD and the transfer transistor M1 are arranged inside the p-well has a weaker collection performance of signal charges and thus a lower sensitivity compared to the solid-state imaging devices according to the first and second embodiments. However, since a p-n junction capacitor is formed between the n-type semiconductor region 118 and the p-type semiconductor region 142 also in a portion in which the gap 140 is arranged, the saturation charge amount of the photoelectric converter PD can be larger than that in the solid-state imaging devices according to the first and second embodiments. It is possible to select as appropriate which of the configurations to use in accordance with more important characteristics, purpose, or the like.

As discussed above, according to the present embodiment, it is possible to increase the saturation charge amount while stably maintaining the sensitivity of the photoelectric converter. This can realize a solid-state imaging device having a high sensitivity and a large saturation signal amount in a stable manner.

Fourth Embodiment

A solid-state imaging device according to a fourth embodiment of the present invention will be described with reference to FIG. 10 to FIG. 12. The same components as those in the solid-state imaging devices according to the first to third embodiments are labeled with the same reference numerals, and the description thereof will be omitted or simplified.

Figure 10:
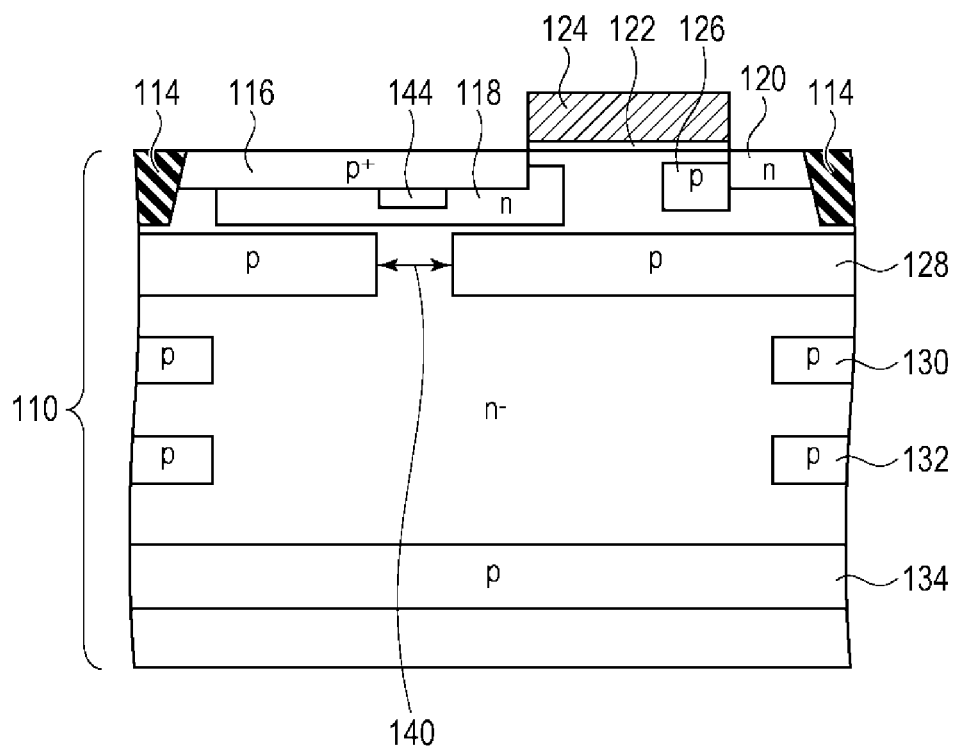
FIG. 10 is a schematic cross-sectional view of a pixel of a solid-state imaging device according to a fourth embodiment of the present invention.

FIG. 10 is a schematic cross-sectional view of a pixel of the solid-state imaging device according to the present embodiment. FIG. 11 and FIG. 12 are the diagrams of the potential inside a semiconductor substrate when signal charges are transferred.

As illustrated in FIG. 10, the solid-state imaging device according to the present embodiment is the same as the solid-state imaging devices according to the first and second embodiments except that it further has a p-type semiconductor region 144. The p-type semiconductor region 144 is provided such that at least a part thereof overlaps with the gap 140 in the plan view. The p-type semiconductor region 144 is provided between the p-type semiconductor region 116 and the n-type semiconductor region 118 in the cross-sectional view as illustrated in FIG. 10. The upper part of the p-type semiconductor region 144 is in contact with the lower part of the p-type semiconductor region 116, and the p-type semiconductor region 144 is provided inside the semiconductor substrate 110 shallower than the lower part of the n-type semiconductor region 118.

As described above, a p-n junction capacitor is formed between the n-type semiconductor region 118 and the p-type semiconductor region 128. Therefore, when the potential at which the n-type semiconductor region 118 is depleted (depletion potential) is the same as that in the case where no p-type semiconductor region 128 is provided, the saturation charge amount of the photoelectric converter PD can be increased.

In view of the transfer performance in transferring signal charges from the n-type semiconductor region 118 to the n-type semiconductor region 120, however, with the same depletion potential, the transfer performance is lower in the case where the p-type semiconductor region 128 is provided than in the case where no p-type semiconductor region 128 is provided.

Figure 11:
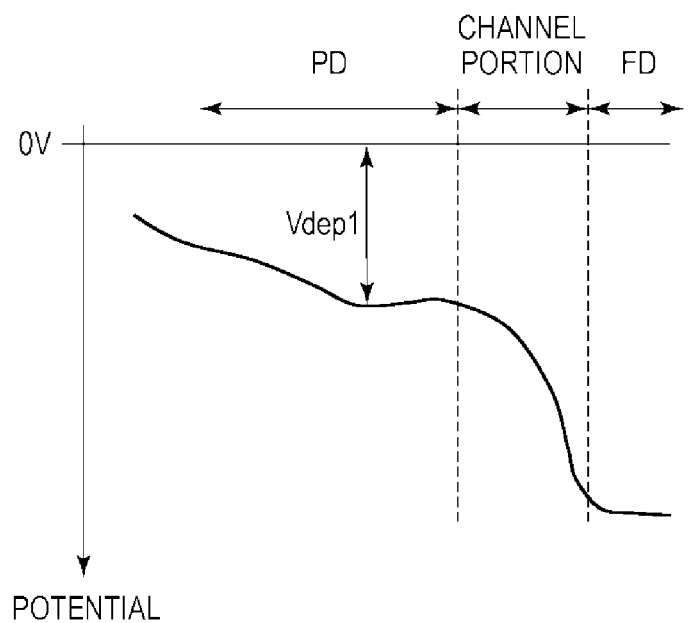
FIG. 11 and FIG. 12 are diagrams of the potential inside a semiconductor substrate when signal charges are transferred.
Figure 12:
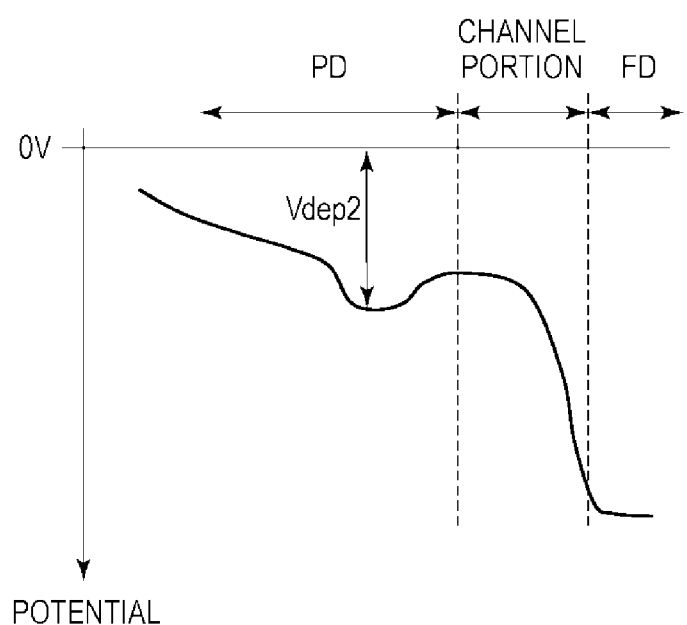

FIG. 11 and FIG. 12 are diagrams illustrating the potential distribution of a portion from the photoelectric converter PD (the n-type semiconductor region 118) to the floating diffusion FD (the n-type semiconductor region 120) via a channel portion when the transfer transistor M1 is in an on-state. FIG. 11 corresponds to a case where no p-type semiconductor region 128 is provided and represents the depletion potential in this case as Vdep1. FIG. 12 corresponds to a case where the p-type semiconductor region 128 is provided and represents the depletion potential in this case as Vdep2.

When the depletion potential Vdep1 is equal to the depletion potential Vdep2, the saturation charge amount of the photoelectric converter PD is larger in the case where the p-type semiconductor region 128 is provided than in the case where no p-type semiconductor region 128 is provided.

When the p-type semiconductor region 128 is provided, however, a relatively larger recess of the potential occurs in the photoelectric converter PD as illustrated in FIG. 12, and the transfer performance decreases. This potential recess occurs correspondingly to the position where the gap 140 of the p-type semiconductor region 128 is provided. This is because the n-type semiconductor region 118 on the gap 140 is less likely to be depleted compared to the overlapping portion of the n-type semiconductor region 118 and the p-type semiconductor 128 in the plan view. Signal charges are likely to be retained in such a potential recess at a transfer operation.

The saturation charge amount of the photoelectric converter PD in the solid-state imaging device is the maximum value of the charge amount which can be held in the photoelectric converter PD, which can be said to be the charge amount which can be transferred to the floating diffusion FD. The presence of the p-type semiconductor region 128 increases the p-n junction capacitance with the n-type semiconductor region 118, and the n-type semiconductor region 118 can hold more charges if the depletion potential is the same. On the other hand, the presence of the gap 140 is likely to generate a potential recess and may cause a reduction in the transfer performance. Therefore, the saturation charge amount of the photoelectric converter PD to increase compared to the case where no p-type semiconductor region 128 is provided, the increase amount thereof is less than that corresponding to the increase amount of the p-n junction capacitance. Further, in some cases, there may be little increase in the saturation charge amount.

In such a point of view, in the solid-state imaging device according to the present embodiment, the p-type semiconductor region 144 is provided inside the n-type semiconductor region 118 in a location substantially overlapping with the gap 140 in the plan view.

With the p-type semiconductor region 144 being provided, the potential recess in the n-type semiconductor region 118 in a portion in which the gap 140 is provided is removed, and the charge amount which can be transferred to the floating diffusion FD can be increased. The increase amount of the saturation charge amount in this case compared to the case where no p-type semiconductor region 128 is provided is greater than the increase amount of the p-n junction capacitance formed between the n-type semiconductor region 118 and p-type semiconductor region 128.

Even when the p-type semiconductor region 128 is not provided, the center portion of the n-type semiconductor region 118 has the highest potential and thus originally a portion where a potential recess is likely to occur. When the p-type semiconductor region 128 is introduced with the gap 140 near the center portion of the n-type semiconductor region 118, the potential recess becomes even deeper. By providing the p-type semiconductor region 144 in a portion in which a potential recess occurs, it is possible to reduce a potential recess or a barrier and increase the charge amount which can be transferred to the floating diffusion FD.

Note that, since the upper part of the p-type semiconductor region 144 is in contact with the p-type semiconductor region 116 and the n-type semiconductor region 118 is present in the lower part of the p-type semiconductor region 144, the p-type semiconductor region 144 does not close the gap 140 and thus leads to no reduction in the sensitivity. Therefore, while maintaining the same sensitivity as the case where no p-type semiconductor region 128 is provided, it is possible to increase the amount of transferable signal charges compared to the first embodiment.

As discussed above, according to the present embodiment, it is possible to increase the saturation charge amount while stably maintaining the sensitivity of the photoelectric converter. This can realize a solid-state imaging device having a high sensitivity and a large saturation signal amount in a stable manner.

Fifth Embodiment

Figure 13:
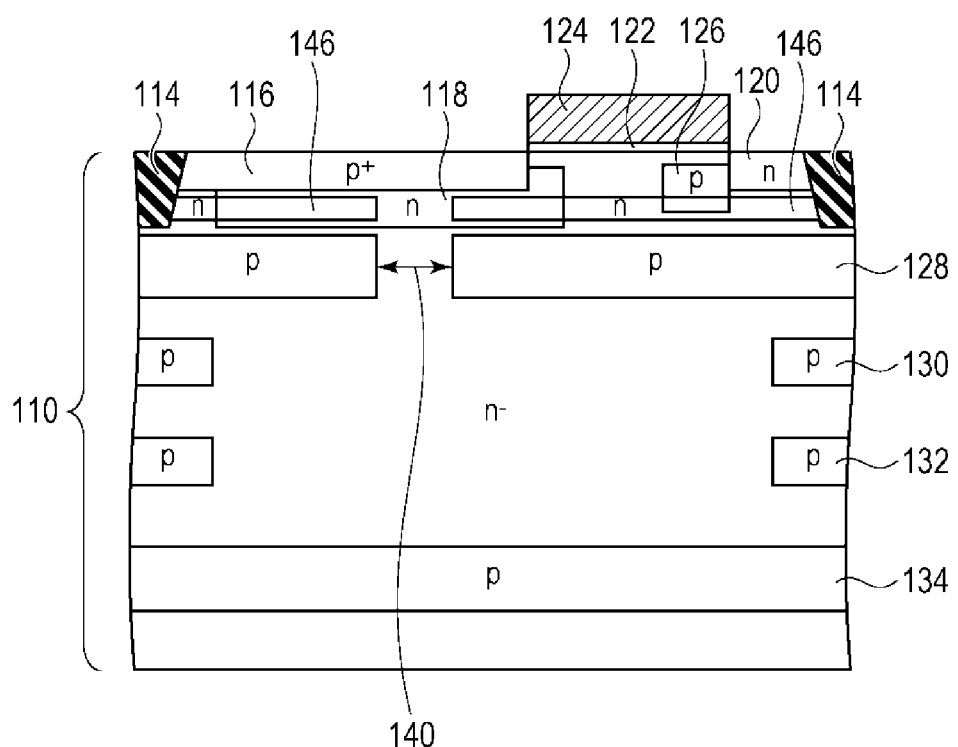
FIG. 13 is a schematic cross-sectional view of a pixel of a solid-state imaging device according to a fifth embodiment of the present invention.

A solid-state imaging device according to a fifth embodiment of the present invention will be described with reference to FIG. 13. The same components as those in the solid-state imaging device according to the first embodiment are labeled with the same reference numerals, and the description thereof will be omitted or simplified. FIG. 13 is a schematic cross-sectional view of a pixel of the solid-state imaging device according to the present embodiment.

The solid-state imaging device according to the present embodiment is the same as the solid-state imaging device according to the first or second embodiment except that it further includes an n-type semiconductor region 146 as illustrated in FIG. 13. The n-type semiconductor region 146 is provided in the depth between the p-type semiconductor region 116 and the p-type semiconductor region 128 in substantially the same region in the plan view as the region in which the p-type semiconductor region 128 is provided. The n-type semiconductor region 146 is located in the depth substantially the same as the n-type semiconductor region 118. Note that substantially the same region intends that the n-type semiconductor region 146 and the p-type semiconductor region 128 are formed by ion implantation using the same mask pattern.

The impurity concentration of the n-type semiconductor region 118 is set such that the same saturation charge amount as in the case where no n-type semiconductor region 146 is provided can be obtained, for example. Thus, the impurity concentration of the n-type semiconductor region 118 in the solid-state imaging device of the present embodiment is lower than the impurity concentration of the n-type semiconductor region 118 in the solid-state imaging device of the first embodiment. Since no n-type semiconductor region 146 is provided in the portion overlapping with the gap 140 in a plan view, a potential recess is less likely to be formed in the n-type semiconductor region 118 of the portion in which the gap 140 is provided, which can increase the amount of transferable signal charges.

Furthermore, in the present embodiment, the p-type semiconductor region 128 and the n-type semiconductor region 146 can be formed in the same mask process, and the number of photolithography processes can be reduced by one compared to the case of the fourth embodiment. Further, no positioning displacement occurs between the p-type semiconductor region 128 and n-type semiconductor region 146, which allows a stable saturation charge amount, stable transfer characteristics, and stable sensitivity characteristics to be obtained.

As discussed above, according to the present embodiment, it is possible to increase the saturation charge amount while stably maintaining the sensitivity of the photoelectric converter. This can realize a solid-state imaging device having a high sensitivity and a large saturation signal amount in a stable manner.

Sixth Embodiment

An imaging system according to a sixth embodiment of the present invention will be described with reference to FIG. 14. The same components as those in the solid-state imaging devices according to the first to fifth embodiments are labeled with the same reference numerals, and the description thereof will be omitted or simplified. FIG. 14 is a block diagram illustrating a general configuration of the imaging system according to the present embodiment.

The solid-state imaging devices 100 described in the above first to fifth embodiments can be applied to various imaging systems. Examples of the applicable imaging systems may include a digital still camera, a digital camcorder, a surveillance camera, a copier machine, a facsimile machine, a mobile phone, an on-vehicle camera, an observation satellite, and the like. Further, a camera module having an optical system, such as a lens, and an imaging device may be included in the imaging system. FIG. 14 illustrates a block diagram of a digital still camera as an example of the above.

The imaging system 200 illustrated as an example in FIG. 14 includes an imaging device 201, a lens 202 that captures an optical image of an object onto the imaging device 201, an aperture 204 for changing a light amount passing through the lens 202, and a barrier 206 for protecting the lens 202. The lens 202 and the aperture 204 form an optical system that converges a light onto the imaging device 201. The imaging device 201 is the solid-state imaging device 100 described in the first to fifth embodiments and converts an optical image captured by the lens 202 into image data.

The imaging system 200 further includes a signal processing unit 208 that processes an output signal output from the imaging device 201. The signal processing unit 208 performs AD conversion that converts an analog signal output from the imaging device 201 into a digital signal. Further, the signal processing unit 208 performs other operations of performing various correction or compression if necessary and outputting image data. An AD conversion unit that is a part of the signal processing unit 208 may be formed on the semiconductor substrate in which the imaging device 201 is provided, or may be formed on a different semiconductor substrate from the imaging device 201. Further, the imaging device 201 and the signal processing unit 208 may be formed on the same semiconductor substrate.

The imaging system 200 further includes a buffer memory unit 210 for temporarily storing image data therein and an external interface unit (external I/F unit) 212 for communicating with an external computer or the like. The imaging system 200 further includes a storage medium 214 such as a semiconductor memory for performing storage or readout of image pickup data and a storage medium control interface unit (storage medium control I/F unit) 216 for performing storage or readout on the storage medium 214. Note that the storage medium 214 may be embedded in the imaging system 200 or may be removable.

The imaging system 200 further includes a general control/operation unit 218 that performs various computation and controls the entire digital still camera and a timing generation unit 220 that outputs various timing signals to the imaging device 201 and the signal processing unit 208. Here, the timing signal or the like may be input from the outside, and the imaging system 200 may have at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. Further, the signal processing unit 208 uses an imaging signal to generate an image.

Application of the solid-state imaging device 100 of any of the first to fifth embodiments can realize an imaging system that can acquire a good quality image with a high sensitivity and a large saturation signal amount in a stable manner.

Seventh Embodiment

Figure 15A:
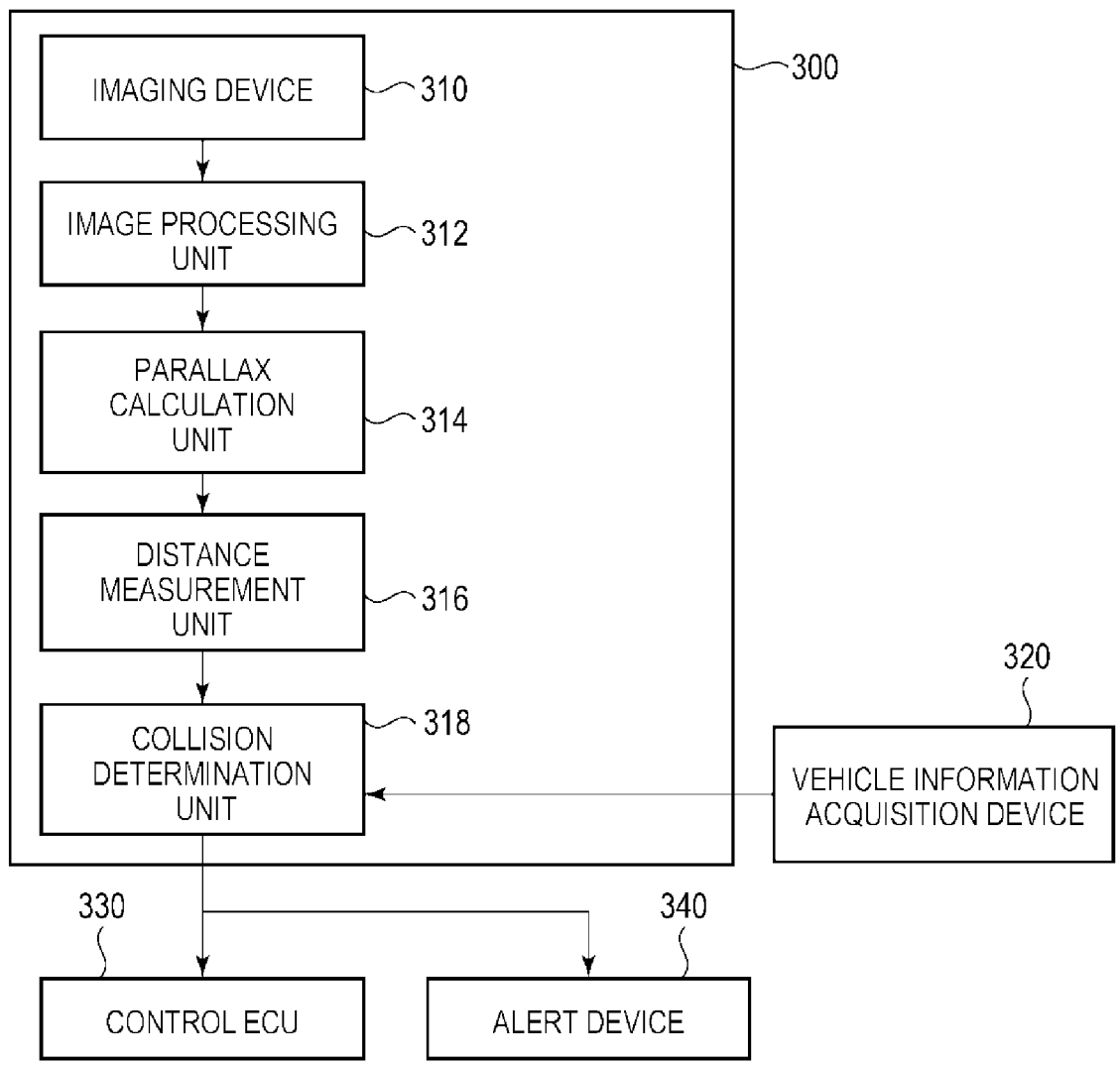
FIG. 15A is a diagram illustrating an example configuration of an imaging system according to a seventh embodiment of the present invention.
Figure 15B:
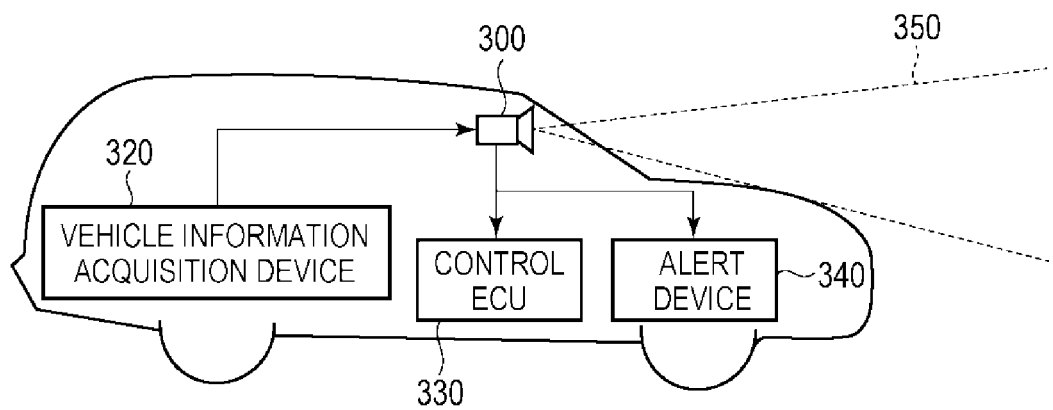
FIG. 15B is a diagram illustrating an example configuration of a movable object according to the seventh embodiment of the present invention.

An imaging system and a movable object according to a seventh embodiment of the present invention will be described with reference to FIG. 15A and FIG. 15B. FIG. 15A is a diagram illustrating a configuration of the imaging system according to the present embodiment. FIG. 15B is a diagram illustrating a configuration of the movable object according to the present embodiment.

FIG. 15A illustrates an example of the imaging system regarding an on-vehicle camera. The imaging system 300 includes an imaging device 310. The imaging device 310 is any of the solid-state imaging devices 100 described in the above first to fifth embodiments. The imaging system 300 includes an image processing unit 312 that performs image processing on a plurality of image data acquired by the imaging device 310 and a parallax calculation unit 314 that calculates a parallax (a phase difference of parallax images) from the plurality of image data acquired by the imaging system 300. Further, the imaging system 300 includes a distance measurement unit 316 that calculates a distance to the object based on the calculated parallax and a collision determination unit 318 that determines whether or not there is a collision possibility based on the calculated distance. Here, the parallax calculation unit 314 and the distance measurement unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected with a control ECU 330, which is a control device that outputs a control signal for causing a vehicle to generate braking force based on a determination result by the collision determination unit 318. Further, the imaging system 300 is connected with an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 15B illustrates the imaging system in a case of capturing a front area of a vehicle (a capturing area 350). The vehicle information acquisition device 320 transmits instructions to the imaging system 300 or the imaging device 310 to perform a predetermined operation. Such a configuration can further improve the ranging accuracy.

Although the example of control for avoiding a collision to another vehicle has been illustrated in the above description, the embodiment is applicable to automatic driving control for following another vehicle, automatic driving control for not going out of a traffic lane, or the like. Furthermore, the imaging system is not limited to a vehicle such as the subject vehicle, and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the above-described embodiments, but various modifications are possible.

For example, the embodiment of the present invention includes an example in which a part of the configuration of any of the embodiments is added to another embodiment and an example in which a part of the configuration of any of the embodiments is replaced with a part of the configuration of another embodiment. For example, the p-type semiconductor region 144 of the fourth embodiment may be applied to the solid-state imaging device of the third or fifth embodiment.

Further, although the examples of the solid-state imaging devices using the photoelectric converter PD that generates electrons as signal charges have been described in the above-described embodiments, the present invention can be applied in a similar manner to a solid-state imaging device using a photoelectric converter PD that generates holes as signal charges. In this case, the conductivity type of the semiconductor region forming respective portions of the pixel 12 is the opposite conductivity type. Note that the names of the source and the drain of the transistors described in the above embodiments may be different in accordance with the conductivity type, a focused function, or the like of the transistors, and all or some of the sources and the drains described above may be described by opposite names.

Further, the circuit configuration of the pixel 12 illustrated in FIG. 2 is an example and can be changed as appropriate. The pixel 12 may be any pixel as long as it has at least the photoelectric converter PD and the transfer transistor M1 that transfers charges from the photoelectric converter PD to the charge holding portion. The present invention can be applied not only to a CMOS image sensor but also to a CCD image sensor. Further, the charge holding portion to which charges are transferred from the photoelectric converter PD is not necessarily required to be the floating diffusion FD as an input node of the amplifier unit, but may be a charge holding portion separate from the photoelectric converter PD and the floating diffusion FD.

Further, although the p-type semiconductor region 128 is formed of a stripe pattern extending in the row direction in the plan view in the above-described first embodiment, it may be formed of a stripe pattern extending in the column direction in the plan view. Also in this case, the gap 140 between the p-type semiconductor region 128a and the p-type semiconductor region 128b is arranged so as to traverse the n-type semiconductor region 118 in the plan view. Similarly, the gap 140 may be a pattern extending in the column direction in the second embodiment.

Further, in the above-described fourth and fifth embodiments, features of each embodiment have been described based on the configuration of the solid-state imaging devices according to the first and second embodiments. In the fourth and fifth embodiments, however, the planar layout of the p-type semiconductor region 128 is not necessarily required to be the same as that illustrated in FIG. 3 or FIG. 6. For example, the same planar layout as that of the p-type semiconductor region 128 illustrated in FIG. 8 may be applied in the solid-state imaging device of the fourth and fifth embodiments.

In this case, as described above, the shape of the corner portions of the gap 140 may vary, which is likely to affect variation in the characteristics. However, when the effect of increasing the saturation charge amount is larger even taking estimation of this variation into account, such as when the planar shape of the n-type semiconductor region 118 is close to a square, for example, it is possible to obtain a larger saturation charge amount than the conventional art while maintaining the sensitivity even in the case of the planar layout of FIG. 8.

Further, the imaging systems illustrated in the sixth and seventh embodiments are illustrated as an exemplary imaging system to which the imaging device of the present invention can be applied, and imaging systems to which the imaging device of the present invention can be applied are not limited to the configurations illustrated in FIG. 14 to FIG. 15B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-255913, filed Dec. 28, 2016, which is hereby incorporated by reference herein in its entirety.

What is claimed is:

1. A solid-state imaging device comprising:
a semiconductor substrate including a plurality of pixels, each of the plurality of pixels including a photoelectric converter,
wherein the photoelectric converter includes a first semiconductor region of a first conductivity type, a second semiconductor region of a second conductivity type provided under the first semiconductor region, and a third semiconductor region provided under the second semiconductor region,
wherein the semiconductor substrate includes a surface,
wherein the first semiconductor region has a first end portion and a second end portion opposing to the first end portion in a plan view viewing from above the surface, the first end portion and the second end portion are arranged in a same depth of the semiconductor substrate,
wherein the solid-state imaging device further comprises an electric path area arranged between the first end portion and the second end portion, through which the signal charge is transferred between the first semiconductor region and the third semiconductor region, and
wherein the electric path area extends, in a direction parallel to the surface, from a part of the first end to a part of the second end and extends beyond the part of the first end and the part of the second end.

2. The solid-state imaging device according to claim 1, wherein the electric path area is arranged so as to traverse the first semiconductor region in the plan view along the direction.

3. The solid-state imaging device according to claim 1, wherein the electric path area is surrounded by the second semiconductor region in the plan view.

4. The solid-state imaging device according to claim 1, wherein the photoelectric converter further includes a fourth semiconductor region of the second conductivity type provided at an opposite side to the second semiconductor region with respect to the first semiconductor region.

5. The solid-state imaging device according to claim 1, wherein the photoelectric converter is provided between the first semiconductor region and the fourth semiconductor region and further includes a fifth semiconductor region of the second conductivity type at least a part of which overlaps with the electric path area in the plan view.

6. The solid-state imaging device according to claim 1, wherein the photoelectric converter further includes a sixth semiconductor region of the first conductivity type provided in a depth between the first semiconductor region and the second semiconductor region in the same region in the plan view as a region in which the second semiconductor region is provided.

7. The solid-state imaging device according to claim 1, wherein each of the plurality of pixels further includes a charge holding portion and further includes a transfer transistor that transfers charges from the photoelectric converter to the charge holding portion, and
wherein the electric path area does not overlap with a gate electrode of the transfer transistor in the plan view.

8. The solid-state imaging device according to claim 1, wherein the electric path area extends through a center portion of the second first semiconductor region in the plan view.

9. The solid-state imaging device according to claim 1 further comprising a seventh semiconductor region of the second conductivity type provided under the third semiconductor region, and an eighth semiconductor region of the first conductivity type provided under the seventh semiconductor region,
wherein the photoelectric converter is electrically isolated from the eighth semiconductor region by the seventh semiconductor region.

10. The solid-state imaging device according to claim 1, wherein the second semiconductor region includes a first region and a second region each of which overlaps with the first semiconductor region in the plan view, and
wherein the first region and the second region are apart from each other over a region from the part of the first end to the part of the second end by the electric path area.

11. The solid-state imaging device according to claim 10, wherein the third semiconductor region extends from regions under the first region and the second region to the electric path area.

12. An imaging system comprising:
the solid-state imaging device according to claim 1; and
a signal processing unit that processes a signal output from the pixel of the solid-state imaging device.

13. A movable object comprising:
the solid-state imaging device according to claim 1;
a distance information acquisition unit configured to acquire distance information of a distance to an object, from parallax images based on a signal from the solid-state imaging device; and
a control unit configured to control the movable object based on the distance information.

14. The solid-state imaging device according to claim 1, wherein the first semiconductor region accumulates a signal charge generated by an incident light.

15. The solid-state imaging device according to claim 1, wherein the surface is configured to receive an incident light.

16. The solid-state imaging device according to claim 1, wherein the semiconductor substrate includes a transistor having a gate arranged on the surface.

* * * * *